United States Patent [19]

Enderby et al.

[11] 4,052,672

[45] Oct. 4, 1977

[54] EXTENDED PHASE-RANGE, HIGH FIDELITY MODULATOR ARRANGEMENT

[75] Inventors: Ralph Thomas Enderby, Coral Springs; Francis Robert Steel, Parkland; Alan Michael Victor, Cooper City, all of Fla.

[73] Assignee: Motorola, Inc., Schaumburg, Ill.

[21] Appl. No.: 707,747

[22] Filed: July 22, 1976

[51] Int. Cl.² .............................................. H03C 3/06
[52] U.S. Cl. ..................................... 325/147; 325/184; 325/148; 332/16 R
[58] Field of Search ................. 325/147, 145, 184, 17, 325/133, 7, 45, 46, 126, 163, 148; 332/16 R, 19

[56] References Cited

U.S. PATENT DOCUMENTS

| | | | |
|---|---|---|---|
| 3,393,380 | 7/1968 | Webb | 325/184 |
| 3,587,003 | 6/1971 | Chastagnier | 325/19 |
| 3,644,831 | 2/1972 | Latker et al. | 325/147 |
| 3,805,192 | 4/1974 | Ocnaschek et al. | 332/16 R |
| 3,810,018 | 5/1974 | Stover | 325/45 |
| 4,006,429 | 2/1977 | Talbot | 332/19 |

Primary Examiner—Robert L. Griffin
Assistant Examiner—Tommy P. Chin
Attorney, Agent, or Firm—Donald B. Southard; James W. Gillman

[57] ABSTRACT

An improved wideband phase modulator suitable as a simple modulation interface for existing phase modulated transmitters. The disclosed modulator arrangement utilizes a high stability reference oscillator and an associated phase locked loop for optimum long term stability. Means are included for extended phase range and high fidelity of modulation irrespective of loop bandwidth. Both tone and digital modulation is accommodated.

5 Claims, 2 Drawing Figures

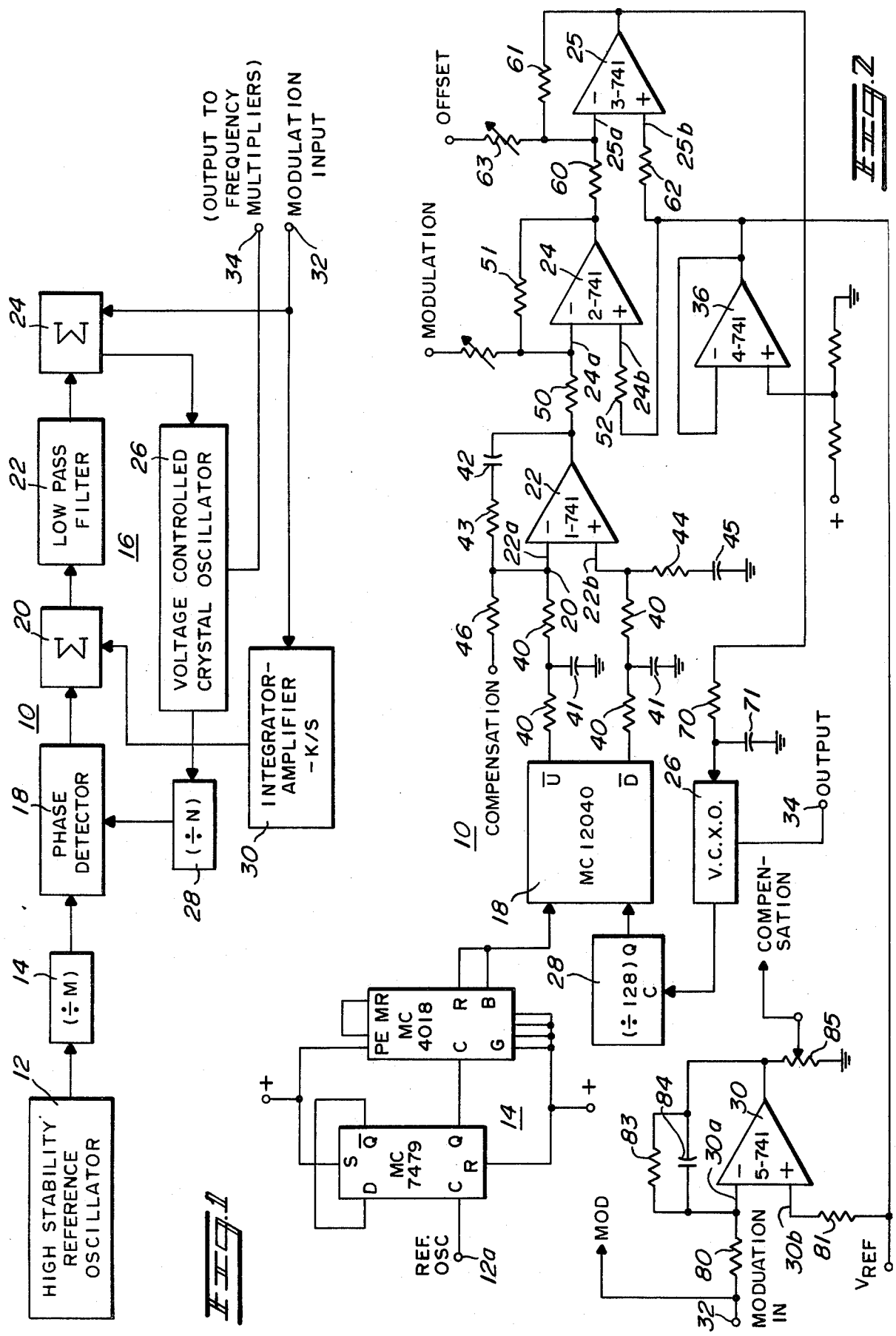

EXTENDED PHASE-RANGE, HIGH FIDELITY MODULATOR ARRANGEMENT

BACKGROUND OF THE INVENTION

The present invention relates in general to modulators and more particularly to an improved extended range phase modulation arrangement for accommodating both digital and tone modulation and which exhibits not only the desired long term stability but offers optimum fidelity of modulation at any desired loop bandwidth.

Present day phase modulated transmitters in highly congested metrolpolitan areas may well be expected to accomodate both digital and tone modulation. Moreover, the requirements of carrier frequency stability in a simulcast environment is such as to more often than not require a high stability reference oscillator. However, it is known that such oscillators may prove to be rather difficult to modulate effectively. This is particularly so concerning digital modulation at the conventional ±4 KHz deviation reference.

In any event, certain techniques have been developed to provide the desired long term stability and extended phase range capability. In addition to the high stability reference oscillator, a phase locked loop may be employed in conjunction with a suitable voltage controlled oscillator whereby the long term stability of the resultant carrier frequency is preserved and maintained by the high stability reference oscillator. The desired extended phase range capability is effectively realized by the utilization of a frequency divider arrangement in the loop feedback path. For example, the output of the voltage controlled oscillator may inteface directly with the existing frequency multipliers in the associated transmitter apparatus.

Notwithstanding the realization of the desired long term stability for phase or frequency modulators of the foregoing type, a problem may well exist concerning modulation capabilities and the maintenance of the desired degree of fidelity demanded in present day communication systems. If the bandwidth of the phase locked loop, principally determined by the lowpass filter in the feedback path, is too narrow, low frequency distortion, or droop, may well occur. The overall loop response is simply too slow to accommodate the specifics of the modulation. On the other hand, when the loop is made wide enough to provide for fast response, the injected modulation tends to be cancelled out within the loop.

SUMMARY OF THE INVENTION

Accordingly, it is an object of the present invention to provide an improved wide range phase modulator of high stability and high fidelity capable of accommodating both digital and tone modulation and which overcomes the foregoing deficiencies.

A more particular object of the present invention is to provide an improved phase modulation arrangement of the foregoing type which utilizes a phase locked loop and reference oscillator for long term stability which nevertheless has a high degree of fidelity and is substantially independent of loop bandwidth.

In practicing the invention, a phase modulator arrangement is provided which includes a high stability reference oscillator and a phase locked loop with voltage controlled oscillator. A frequency divider is utilized to provide the desired extended phase range capability. Modulation information is then added at two separate injecion points within the phase locked loop. The first injection point is essentially at the input of the voltage controlled oscillator and comprises modulation information, whether digital or tone, in essentially the same form as initially generated. The second modulation injection point is preferably at the output of the phse detector within the phase locked loop. In this instance, however, the modulation is first integrated and then injected and, in this manner, cancels or compensates for any adverse effect the modulation would otherwise have on the operation of the phase modulator apparatus as a whole. More specifically, the output frequency modulation will be undistorted if the gain constant ($K_0$) of the associated integrating amplifier is substantially equal to he product of the frequency modulator and phase detector sensitivity, divided by N where the N frequency divider is utilized.

BRIEF DESCRIPTION OF THE DRAWINGS

The features of the present invention which are believed to be novel are set forth with particularity in the appended claims. The invention itself, however, together with further objects and advantages thereof, may best be understood by reference to the following description when taken in conjunction with the accompanying drawings, in which:

FIG. 1 is a block diagram of a portion of a radio communications transmitter constititing a phase modulator, which modulator has been constructed in accordance with the present invention; and FIG. 2 is a partial logic and schematic representation of the phase comparator of FIG. 1.

DESCRIPTION OF THE PREFERRED EMBODIMENT

Referring now to the drawings, a phase modulator 10 is shown in FIG. 1 as part of a radio transmitter apparatus (not shown), which modulator has been constructed in accordance with the present invention. The modulator arrangement 10 includes a high stability reference oscillator 12, the construction of which may be of any suitable design known in the art such that further and more detailed description is not necessary. The output of the reference oscillator is coupled to a frequency divider 14 which divides by some given number, designated here as "M", the only limitation being that it be an integer. The output of the frequency divider 14 forms one input to a phase detector 18 comprising one part of the overall phase locked loop 16. The phaselock loop 16 includes a further component parts a summer 20, which is coupled to a lowpass filter 22, the latter in turn being coupled to a second summer 24. The output of summer 24 is coupled to a voltage controlled crystal oscillator 26, the output of which is coupled to a frequency divider networ 28, which divides by some given number, designated here as "N" again, the only limitation is that it be an integer. "M" and "N" may or may not be equal to one another. The loop is closed by coupling the output of the divider network 28 to another input of the phase detector 18.

Modulation signal components appearing at input terminal 32 is applied to the voltage controlled oscillator (VCO) 26 through the summer 24 and to the output of phase detector 18 at summer 20. However, in the latter case, it will be noted that the modulation components are first integrated in an integrator/amplifier 30 before application to summer 20. The output signal from the modulator 10 is at terminal 34 forming the output of the VCO 26.

In operation, the modulation signal information at the modulation input terminal 32 is applied through summer 24 to the input of the VCO 26. The output modulation at terminal 34 may then be applied directly to the transmitter frequency multipliers (not shown). The design approach herein utilized dictates a phased lock loop where the reference is derived from a high stability oscillator, such as identified at 12, for obtaining the desired long term stability. By using a frequency divider, such as identified at 28, in the feedback portion of the phase locked loop 16, the phase range of modulator 10 is effectively multiplied by N.

Without more however, the modulator 10 will exhibit certain deficiencies whatever the loop operational characteristics may be selectively designed to be. For example, if loop parameters are set so as to provide an apropriate fast response, the resultant wide bandwidth may well permit cancellation of the modulation components being passed through the loop. On the other hand, selecting slow response characteristics necessarily results in a narrow bandwidth which may well be incapable of handling the full range of modulation components and will in any event severely compromise fidelity characteristics.

This may be more fully appreciated by considering a narrow, and thus slow, loop characteristic wherein modulation is injected only at summer 24. The closed loop expression $V_{mod}(out)/V_{mod}(in)$ is equal to $$\frac{1}{1 + A\beta}, \text{ or } \frac{1}{1 + \frac{K_O K_D(St_2 + 1)}{S^2 t_1}}$$

where: $t_1$ and $t_2$ are loop filter constants, $K_O$ and $K_D$ are VCO and phase detector constants, respectively. The above expression may be further written as:

$$\frac{V_{mod} \text{ out}}{V_{in}} = \frac{\frac{SG}{t_1}[St_2 + 1]}{S^2 + 2\delta W_n S + W_n^2}$$

In this case:

$$W_n = \frac{(K_O K_D G)^{\frac{1}{2}}}{t_1 N}, \text{ and } \delta = \frac{W_n t_2}{2}$$

For frequencies $W << W_n$, the expression reduces to:

$$\frac{V_{mod} \text{ out}}{V_{in}} = S\left(\frac{N}{K_O K_D}\right)$$

Thus, the loop essentially looks like a differentiator with gain substantially constant, or:

$$\left(\frac{N}{K_O K_D}\right) \frac{\text{volts}}{\text{sec}}$$

If the integrator/amplifier 30, however, is designed to provide a transfer function, such as:

$$\frac{K_O K_D}{N} \frac{\text{volts}}{\text{sec}},$$

it will be appreciated that the differentiation of the modulation by the loop 16 will be effectively cancelled and the modulation components introduced at the VCO input alone will not be affected and full fidelity thereby realized.

In other words in the example described, the modulation will contain a certain degree of low frequency distortion or droop. This condition is analagous to an R-C network, whose corner frequency is not low enough with respect to the input frequency. Such a condition gives rise to the differentiation of the signal. This differentiating process in the present invention is utilized to advantage wherein the modulation is pre-integrated and applied to summer 20. Accordingly, the loop can be chosen to be fast or wide to minimize lockup time.

Accordingly, the present invention requires modulating at two separate points in the phase lock loop. The first, being at the input of the VCO 26 and the second, an integrated version, is applied at the input of loop filter 22. The differentiation of the modulation components by loop 16 is effectively compensated for by the integration action provided by integrator/amplifier 30. Or, said differently, the output frequency modulation is undistorted if the gain constant of the integrating amplifier 30 is equal to the product of frequency modulator and phase sensitivities, divided, or course, by N, where frequency divider N is utilized.

A specific circuit implementation of the modulaor 10 is shown in a diagrammatic form in FIG. 2. Like numerals are employed for corresponding components wherever possible. The reference oscillator 12 of FIG. 1 is not specifically shown in FIG. 2, since it may be of any known design. The output of oscillator 12 is applied to terminal 12a, forming the input of frequency divider 14, in this case consisting of a divide by 2 "D" flip-flop, Motorola type MC7479, and a divide by 16 programmable divider, Motorola type MC4018. The output of divider 14 feeds the phase detector 18, which may be in the form of a digital phase detector integrated circuit of the emitter coupled logic type, module, Motorola type MC12049.

Lowpass filter 22 may be provided in the form of an operational amplifier (Op-Amp), type 741, having a pair of inputs 20a and 20b coupled to detector 18 through series resistors 40. A capacitor 41 is connected from the intermediate junction of resistors 40 to ground. Feedback is provided by series connected capacitor 42 and resistor 43. A further series resistor and capacitor 45 is connected between operational amplifier input 20b and ground.

The output of Op-Amp 22 is coupled through a resistor 50 to one input, 24a, of Op-Amp 24 serving as a summer and d-c amplifier. A resistor 51 is coupled between its output and input 24a. A resistor 52 is connected between the other input 24b of Op-Amp 24 and a voltage reference source, generated at the output of Op-Amp 36. The output of Op-Amp 24 is coupled to a resistance 60 to one input, 25a, of Op-Amp 25, serving as a d-c amplifier. The other input, 25b, is coupled to the voltage reference through a further resistance 62. A feedback resistor 61 is connected between its output and input 25a.

The output of Op-Amp 25 is coupled to the input of the VCO 26 through a resistance 70. A capacitor is connected from the VCO input to ground. The VCO 26 may be of any suitable voltage controlled oscillator arrangement, such as a crystal controlled oscillator well known in the art. The circuit includes an appropriate crystal, neutralizing components and an active element such as a transistor (none of which is specifically shown).

The output of the VCO 26 is coupled through the frequency divider 28 to the input of the phase detector 18. A frequency divider 28 is similar to that described for frequency divider 14. In this case since it is to divide by 128, three divide by two, Motorola type 7479 "D" flip-flops, are included in combination with a programmable divider, Motorola type MC4018, effecting a divide by 16 function.

The integrator/amplifier 30 may be provided in the form of an additional Op-Amp, type 741, having resistances 80 and 81 in respective inputs 30a 30b and a feedback network consisting of parallel connected resistance 83 and capacitance 84. The output of Op-Amp 30 is developed across an adjustable resistance 85.

Concerning pertinent operational characteristics, loop filter constants are selectively controlled by the values of resistances 40, 43 and 44 and capacitors 42 and 44. The integrator constant for integrator/amplifier 30 is essentiallly determined by resistance 83 and capacitor 84. Additional high frequency filtering and decoupling action is obtained through the resistance 70 and capacitor 71. The reference voltage at the output of Op-Amp 36 should be adjusted so that the modulation output is substantially one half of supply voltage. With the reference voltage so adjusted, the nominal VCO voltage will be such that with no modulation the VCO is substantially at center frequency. This may be accomplished with the off set adjustment provided by the adjustable resistance 63 in association with Op-Amp 25.

What is claimed is:

1. An extended range, high fidelity phase modulator including in combination:
   a high stability reference oscillator:
   a phase locked loop comprising at least a phase detector, a lowpass filter, a frequency divider and a voltage controlled oscillator, said phase locked loop having a predetermined gain constant and providing a differentiating action for applied modulation components;
   means coupling said reference oscillator to said phase detector of said phase locked loop;
   first modulation input means for applying modulation signal components to the input of said voltage controlled oscillator; and
   second modulation input means for applying modified modulation signal components to said lowpass filter,
   said second modulation input means including integrating means having a gain constant substantially the reciprocal of said phase locked loop gain constant.

2. An extended range, high fidelity phase modulator in accordance with claim 1 wherein said first modulation input means includes a summer interposed between said lowpass filter and said voltage controlled oscillator.

3. An extended range, high fidelity phase modulator in accordance with claim 1 wherein said second modulation input means includes a summer interposed between said phase detector and said lowpass filter and, further, an integrator/amplifier coupled to said summer.

4. An extended range, high fidelity phase modulator in accordance with claim 3 wherein said lowpass filter, integrator/amplifier and first and second summers are provided in the form of operational amplifiers, said frequency divider in the form of resettable flip-flops, and said phase detector in the form of a digital, emitter coupled logic, integrated circuit.

5. An extended range, high fidelity phase modulator in accordance with claim 1 wherein a further frequency divider is interposed between said reference oscillator and said phase detector of said phase locked loop.

* * * * *